United States Patent
Tweet et al.

(10) Patent No.: US 7,030,002 B2
(45) Date of Patent: Apr. 18, 2006

(54) LOW TEMPERATURE ANNEAL TO REDUCE DEFECTS IN HYDROGEN-IMPLANTED, RELAXED SIGE LAYER

(75) Inventors: Douglas J. Tweet, Camas, WA (US); Jong-Jan Lee, Camas, WA (US); Jer-Shen Maa, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 87 days.

(21) Appl. No.: 10/780,929

(22) Filed: Feb. 17, 2004

(65) Prior Publication Data

US 2005/0181592 A1 Aug. 18, 2005

(51) Int. Cl.
- *H01L 21/28* (2006.01)
- *H01L 21/13205* (2006.01)
- *H01L 21/00* (2006.01)
- *H01L 21/84* (2006.01)
- *H01L 21/36* (2006.01)

(52) U.S. Cl. ............... 438/602; 438/149; 438/486; 438/667; 438/479

(58) Field of Classification Search ............... 438/602, 438/149, 517, 486, 520, 933, 479, 48, 305, 438/522
See application file for complete search history.

(56) References Cited

U.S. PATENT DOCUMENTS

| | | |
|---|---|---|
| 6,464,780 B1 | 10/2002 | Mantl et al. |
| 6,562,703 B1 | 5/2003 | Maa et al. |
| 2003/0143783 A1 | 7/2003 | Maa et al. |

OTHER PUBLICATIONS

Rim et al., *Strained Silicon NMOSFETs for high performance CMOS technology*, 2001 Symposium on VLSI Technology Digest of Technical Papers, p. 59, IEEE (2001).

Nayak et al., *High-mobility Strained-Silicon PMOSFETs*, IEEE Transactions on Electron Devices, vol. 43, 1709 (1996).

Weldon et al., *On the mechanism of the hydrogen-induced exfoliation of silicon*, J. Vac. Sci. Technol. B. 15, 1065, (1997).

Mantl et al., *Strain relaxation of epitaxial SiGe layers on Silicon(100) improved by hydrogen implantation*, Nuclear Instruments and Methods in Physics Research B 147, 29, (1999).

(Continued)

*Primary Examiner*—Chuong Anh Luu
(74) *Attorney, Agent, or Firm*—David C. Ripma

(57) ABSTRACT

A method of forming a SiGe layer having a relatively high Ge content includes preparing a silicon substrate; depositing a layer of SiGe to a thickness of between about 100 nm to 500 nm, wherein the Ge content of the SiGe layer is equal to or greater than 10%, implanting $H_2^+$ ions through the SiGe layer into the substrate at a dose of between about $2\times10^{14}$ $cm^{-2}$ to $2\times10^{16}$ $cm^{-2}$, at an energy of between about 20 keV to 100+ keV; low temperature thermal annealing at a temperature of between about 200° C. to 400° C. for between about ten minutes and ten hours; high temperature thermal annealing the substrate and SiGe layer, to relax the SiGe layer, in an inert atmosphere at a temperature of between about 650° C. to 1000° C. for between about 30 seconds and 30 minutes; and depositing a layer of silicon-based material on the relaxed SiGe layer to a thickness of between about 5 nm to 30 nm.

13 Claims, 5 Drawing Sheets

OTHER PUBLICATIONS

Trinkaus et al., *Strain relaxation mechanism for hydrogen-implanted $Si_{1-x}Ge_x/Silicon(100)$ heterostructures*, Appl. Phys. Lett., 76, 3552, (2000).

Cerofolini, et al., *Hydrogen-related complexes as the stressing species in high-fluence, hydrogen-implanted, single-crystal silicon*, Physical Review B, vol. 46, p. 2061 (1992).

Frabboni et al., *Static disorder depth profile in ion implanted materials by means of large angle convergent beam electron diffraction*, Physical Review Letters, vol. 81, 3155 (1998).

Frabboni, *Lattice strain and static disorder in hydrogen-implanted and annealed single-crystal silicon as determined by large-angle convergent-beam electron diffraction*, Physical Review B, vol. 65, 165436 (2002).

LOW TEMPERATURE ANNEAL TO REDUCE DEFECTS IN HYDROGEN-IMPLANTED, RELAXED SIGE LAYER

FIELD OF THE INVENTION

This invention relates to high speed CMOS integrated circuits, and specifically to a two-step thermal annealing technique

BACKGROUND OF THE INVENTION

In enhanced mobility MOSFET device applications thick, relaxed $Si_{1-x}Ge_x$ buffer layers have been used as virtual substrates for thin strained silicon layers to increase carrier mobility for both NMOS, Rim et al., *Strained Silicon NMOSFETs for high performance CMOS technology*, 2001 Symposium on VLSI Technology Digest of Technical Papers, p. 59, IEEE (2001), and PMOS, Nayak et al., *High-mobility Strained-Silicon PMOSFETs*, IEEE Transactions on Electron Devices, Vol. 43, 1709 (1996). Compared with bulk silicon devices, enhancement in electron mobility of 70% for devices with $L_{eff}$<70 nm have been reported. Enhancements of up to 40% in high-field hole mobility for long-channel devices have also been found. The main current technique to produce a high quality relaxed $S_{i-x}Ge_x$ buffer layer is the growth of a several micron thick compositionally graded layer, Rim and Nayak, supra. However, the density of threading dislocations is still high, e.g., >$10^6 cm^{-2}$. In addition, the integration of a several micron thick $Si_{1-x}Ge_x$ layer into device fabrication is not practical.

Recently, alternative methods to efficiently relax strained SiGe layers on silicon have been sought. Based on the SmartCut™ process, Weldon et al., *On the mechanism of the hydrogen-induced exfoliation of silicon*, J. Vac. Sci. Technol. B. 15, 1065, (1997), for the fabrication of high-quality silicon-on-insulator (SOI) wafers, atomic hydrogen ($H^+$) implantation, followed by an appropriate anneal, has been used to increase the degree of SiGe relaxation and to reduce the density of threading dislocations: Mantl et al., *Strain relaxation of epitaxial SiGe layers on Silicon*(100) *improved by hydrogen implantation*, Nuclear Instruments and Methods in Physics Research B 147, 29, (1999); and U.S. Pat. No. 6,464,780 B1, granted Oct. 15, 2002, for *Method for the production of a monocrystalline layer on a substrate with a non-adapted lattice and component containing one or several such layers*; Trinkaus et al., *Strain relaxation mechanism for hydrogen-implanted $Si_{1-x}Ge_x$/Silicon*(100) *heterostructures*, Appl. Phys. Lett., 76, 3552, (2000); and U.S. patent Publication 2003/0143783 A1, of Maa et al., published Jul. 31, 2003, for *Method to Form Relaxed SiGe Layer with High Ge Content*. Previously, the implantation of either $H^+$ or $H_2^+$ alone, or with boron, He, silicon, or other species for the purpose of relaxing strained SiGe films deposited epitaxially on silicon substrates has been described, U.S. Pat. No. 6,562,703, granted May 13, 2003, to Maa et al., for *Molecular Hydrogen Implantation Method for Forming a Relaxed Silicon Germanium Layer with High Germanium Content*. To produce the desired relaxation after ion implantation, the wafers have been typically annealed at some high temperature, e.g., at about 800° C. for several minutes.

The method of the SmartCut™ process has been the focus of a number of studies. Cerofolini, et al., *Hydrogen-related complexes as the stressing species in high-fluence, hydrogen-implanted, single-crystal silicon*, Physical Review B, vol. 46, p. 2061 (1992), used channeling Rutherford backscattering spectrometry (RBS) to measure the silicon atoms displaced from their crystallographic positions, called the "displacement field," as a result of $H_2^+$ ion implantation and subsequent anneals of Silicon (100) wafers. They implanted $0.8 \times 10^{16}$ cm$^{-2}$ of $H_2^+$ at 31 keV, which is equivalent to $1.6 \times 10^{16}$ cm$^{-2}$ of $H^+$ ions at 15.5 keV. A very interesting "reverse annealing" effect was observed, i.e., the displacement field increased with temperature for samples annealed for two hours as the temperature increased from 200° C. to 400° C., and reached a maximum at between 350° C. to 400° C., then monotonically decreased for samples annealed at higher temperatures up to 800° C. Also, at a fixed temperature of 200° C., the displacement field increased with annealing time up to at least 400 minutes. Furthermore, it was observed that the implanted hydrogen mostly remained in the samples for anneals up to 400° C., but rapidly escaped from those wafers annealed at higher temperatures. From these and other results, Cerofolini et al. concluded that large pressures from hydrogen complexes, most likely one to two $H_2$ molecules in a silicon vacancy position, were responsible for the observed displacement field.

Frabboni and Gambetti later developed a transmission electron microscopy (TEM) technique to analyze static disorder from similar hydrogen-implanted and annealed silicon wafers, Frabboni et al., *Static disorder depth profile in ion implanted materials by means of large angle convergent beam electron diffraction*, Physical Review Letters, vol. 81, 3155 (1998). They confirmed the "reverse annealing" effect and found that the peak static disorder for a sample annealed at 300° C. for two hours was more than twice the as-implanted value, and about twice that for a sample annealed at 500° C. for two hours. Recently Frabboni refined this technique and further confirmed these results. Frabboni, *Lattice strain and static disorder in hydrogen-implanted and annealed single-crystal silicon as determined by large-angle convergent-beam electron diffraction*, Physical Review B, vol. 65, 165436 (2002).

SUMMARY OF THE INVENTION

A method of forming a SiGe layer having a relatively high Ge content includes preparing a silicon substrate; depositing a layer of SiGe to a thickness of between about 100 nm to 500 nm, wherein the Ge content of the SiGe layer is equal to or greater than 10%, by number of atoms; implanting $H_2^+$ ions through the SiGe layer into the substrate at a dose of between about $2 \times 10^{14}$ cm$^{-2}$ to $2 \times 10^{16}$ cm$^{-2}$, at an energy of between about 20 keV to 100+ keV; low temperature thermal annealing at a temperature of between about 200° C. to 400° C. for between about ten minutes and ten hours; high temperature thermal annealing the substrate and SiGe layer, to relax the SiGe layer, in an inert atmosphere at a temperature of between about 650° C. to 1000° C. for between about 30 seconds and 30 minutes; and depositing a layer of tensile-strained silicon on the relaxed SiGe layer to a thickness of between about 5 nm to 30 nm.

It is an object of the invention to produce a thick, relaxed, smooth SiGe film with high Ge content as a buffer layer for a tensile strained silicon film to be used for high speed MOSFET applications.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The method of the invention produces a thick, e.g., 100 nm to 500 nm, relaxed, smooth SiGe film having a high Ge content, e.g., greater than about 20% to 30% or more, as a buffer layer for a tensile strained silicon film, which is suitable for use in high speed MOSFET applications. It is critical that the top portion of this SiGe film be as defect-free as possible in order to minimize leakage currents and to maximize carrier mobilities and device yield. To accomplish this, the dislocations which relax the SiGe film must be confined as much as possible to the region close to the SiGe/silicon substrate interface. This is partly accomplished by having a very high density of dislocations nucleated at this interface, which in turn is due to the strain caused by defects resulting from hydrogen implantation and annealing.

The known state-of-the-art process for relaxing SiGe thin films includes furnace anneals and rapid thermal anneals (RTA) at temperatures in a range of between about 650° C. to 1000° C. for between about one minute to sixty minutes, during which time, hydrogen escapes the sample, which is confirmed by Cerofolini et al. However, during a rapid rise in temperature, the resulting displacement field may not be maximized. The method of the invention demonstrates that it is possible to produce a more efficient relaxation with more misfit dislocations by first performing a low temperature anneal, e.g., at a temperature of between about 200° C. to 400° C., for a time in the range of between about ten minutes to several hours. Because only a small amount of the hydrogen escapes during the low temperature anneal, the low temperature anneal may be followed by a higher temperature anneal, either in a furnace or in a RTA chamber, e.g., 800° C. for 10 minutes. The resulting relaxed SiGe film contains fewer defects in the top portion of the film, providing a better substrate for advanced CMOS transistor fabrication.

Figure 1:
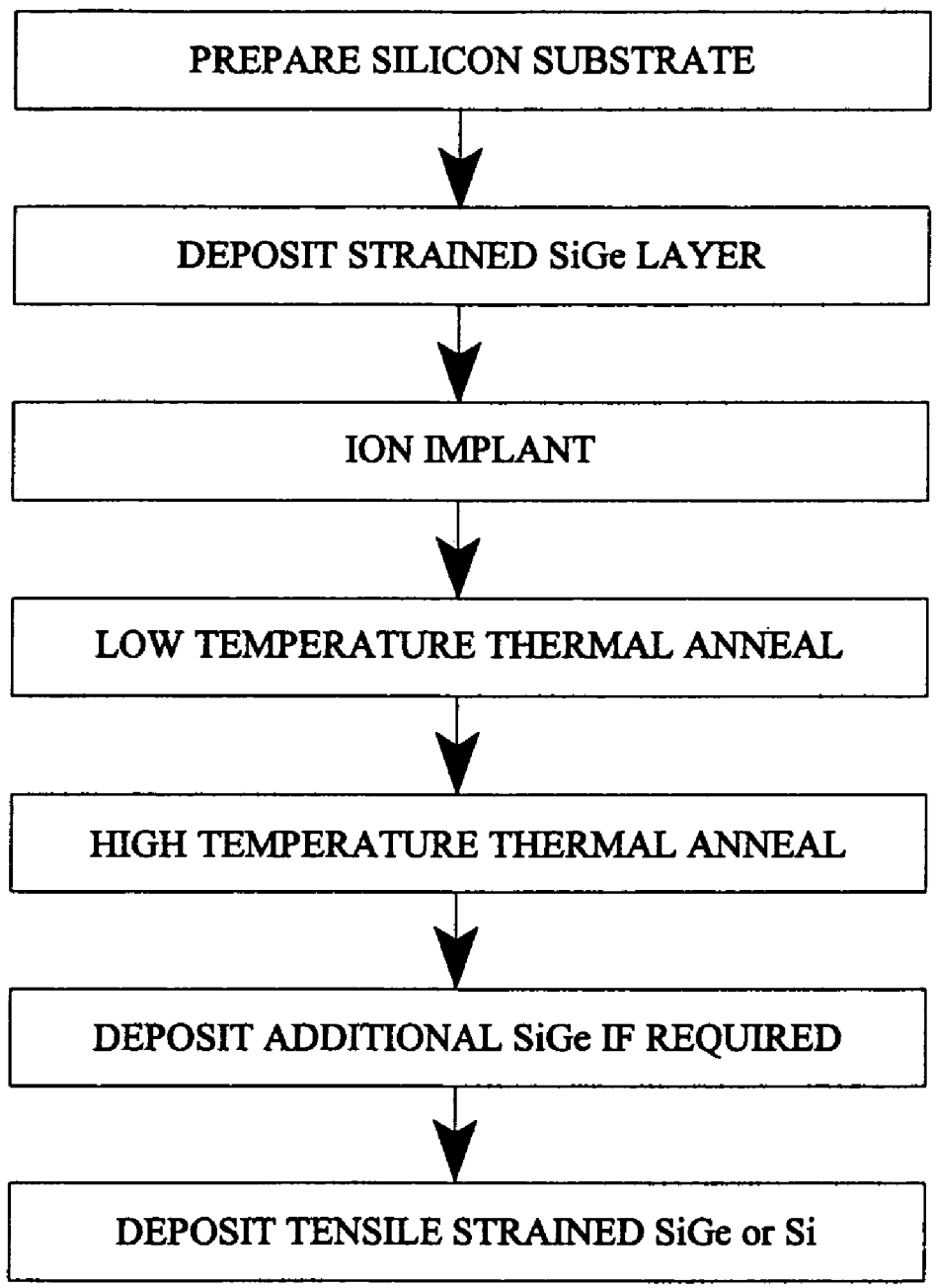
FIG. 1 is a block diagram of the method of the invention.
Figure 2:
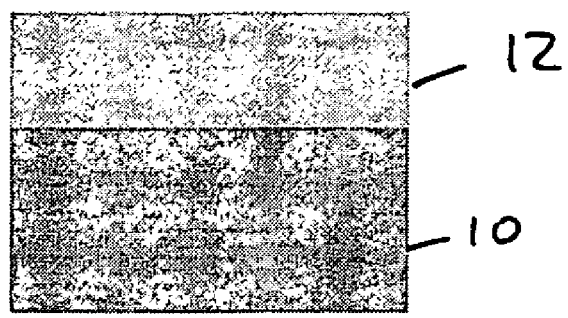
FIGS. 2–7 depicts steps in the method of the invention.

This approach of this invention is described in FIG. 1, and depicted in FIGS. 2–7:

Referring to FIGS. 1 and 2, a silicon substrate 10 is prepared according to state-of-the-art processes. Substrate 10 may be bulk silicon or SIMOX. A layer of strained SiGe 12 is deposited on a silicon substrate to a thickness of between about 100 nm to 500 nm. The Ge content of this layer may be 10% or greater, by number of atoms. Alternatively, a graded Ge profile may be used. The thickness of the first layer SiGe may be in a range of between about 100 nm to 500 nm. The growth conditions and source gases are selected to minimize surface roughness while ensuring good crystallinity. This usually means low temperature growth, e.g., between about 400° C. to 600° C., to produce a metastable, strained SiGe film.

Figure 3:
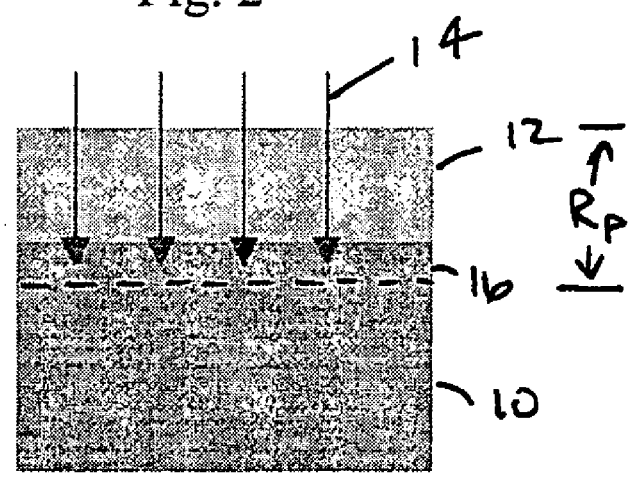

Referring to FIGS. 1 and 3, $H^+$ or $H_2^+$ ions 14, with or without other species, such as boron, He, or silicon, are implanted, forming a Si/H+ layer 16. The dose of $H_2^+$ is in the range of $2 \times 10^{14}$ cm$^{-2}$ to $2 \times 10^{16}$ cm$^{-2}$, and the energy is between about 20 keV to 100+ keV, depending on the SiGe thickness. The determining factor as to implant energy is the need to implant hydrogen ions from the Si/SiGe interface to about 100 nm below the Si/SiGe interface. The dose may be doubled and the energy may be cut in half if H+ ions are used. The implant dose and energy will depend on the dose of the co-implanted species. The dose of the other species, e.g., boron, He, or silicon, may be over a wide range, such as from $1 \times 10^{12}$ cm$^{-2}$ to $1 \times 10^{15}$ cm$^{-2}$. The implant energies also depend on SiGe thickness, and are chosen so that the implantation ranges are similar, with $R_p$ in the range of zero to 100 nm below the Si/SiGe interface. To avoid contamination in the implantation steps, a thin sacrificial silicon oxide layer having a thickness in a range of between about 50 Å to 300 Å may be deposited on the first SiGe layer.

Figure 4:
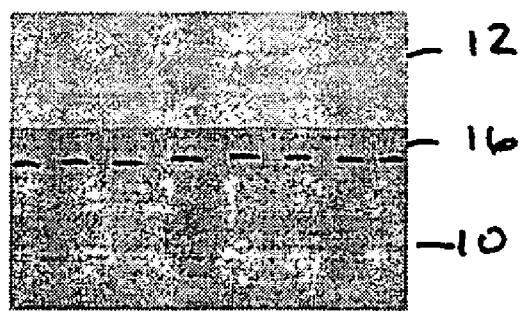

Referring to FIGS. 1 and 4, a low temperature thermal anneal step is performed to maximize the dislocation and strain field without losing too much hydrogen through outdiffusion. This step depicts an essential step of this disclosure: A low temperature anneal in an inert ambient, such as Ar or $N_2$, is performed to maximize the displacement field, and thus the strain, caused by the ion implantation(s). After this anneal, the SiGe will be mostly strained to the silicon substrate. However, if the anneal temperature is too high, and/or the anneal time is too long, the hydrogen will outdiffuse from the sample. In accordance with Cerofolini et al., Frabboni et al., and Frabboni, supra., the anneal should be in the temperature range of between about 200° C. to 400° C. for a time between about ten minutes to ten hours, with the time decreasing as the anneal temperatures increase. Specifically, Cerofolini et al. found an anneal of 350° C. to 400° C. for two hours to be very effective in increasing the displacement field while losing little hydrogen.

Figure 5:
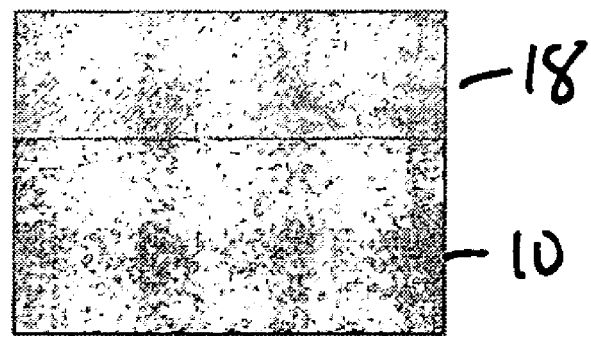

Referring to FIGS. 1 and 5, a higher temperature thermal anneal step is performed to convert strained SiGe layer 12 to a relaxed SiGe layer 18. A higher temperature anneal is performed in an inert ambient, such as Ar or $N_2$, at a temperature in the range of between about 650° C. to 1000° C. This step relaxes the strained SiGe layer while maintaining a smooth surface and low defect level in the top portion of the film.

Figure 6:
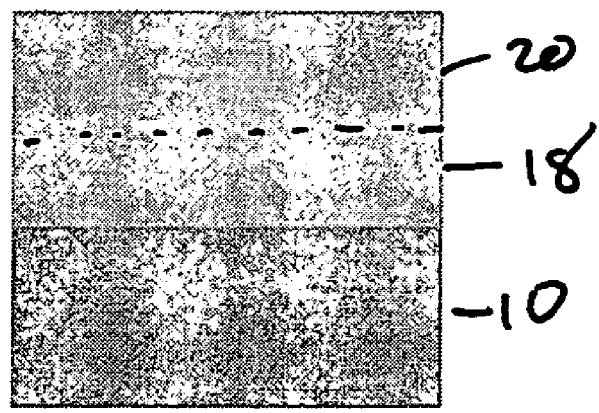

Referring to FIGS. 1 and 6, if required, an additional relaxed SiGe layer 20, or a layer of silicon, is deposited to a thickness at least 100 nm to achieve the desired SiGe layer thickness, which should be at least 300 nm thick, and which is dependent on the intended application of the final device.

Figure 7:
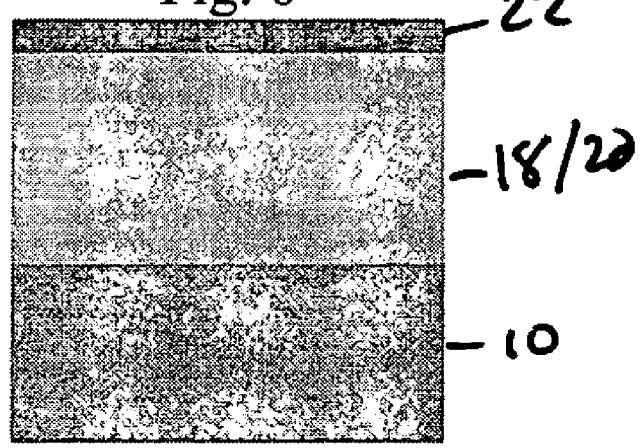

Referring to FIGS. 1 and 7, a layer of tensile strained silicon 22 is deposited on the relaxed SiGe layer to a thickness of between about 5 nm to 30 nm. A thin, e.g., between about 5 nm to 30 nm, tensile-strained silicon layer is epitaxially grown on the relaxed SiGe film.

Other layers of silicon-based material may be deposited in place of layer 22, and may include a tensile strained SiGe layer, a relaxed silicon layer, a compressed SiGe layer. In any of the SiGe layers, the concentration of germanium in the layer may be from a trace to greater than 10%, by number of atoms. Stacks of SiGe, in any form, and silicon, in any form, may also be provided to form layer 22.

In a first experiment using the method of the invention, two SiGe/Silicon wafers were implanted with $1 \times 10^{16}$ cm$^{-2}$ $H_2+$ ions at 63 keV. The SiGe films had a 20% to 30% Ge gradient and were both about 320 nm thick. One was annealed at 800° C. for nine minutes in Argon in a RTA chamber. The other was annealed in a 380° C. furnace for one hour in $N_2$, followed by the same 800° C., nine minute RTA. Both SiGe films were found to be about 80% relaxed with smooth surfaces. This establishes that the 380° C. furnace anneal does not result in the out diffusion of too much hydrogen.

Figure 8:
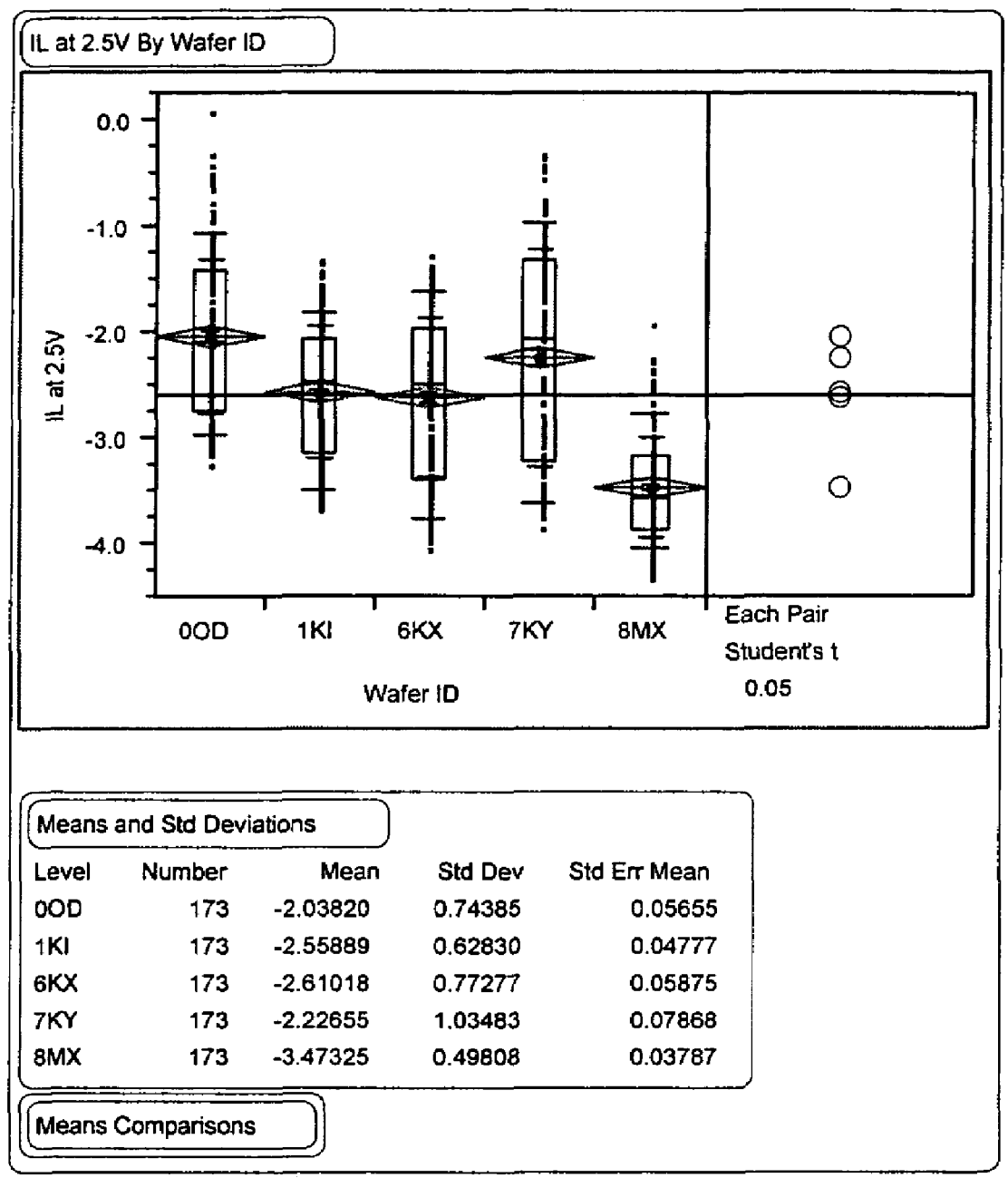
FIG. 8 depicts the results of a 380° C., one-hour furnace anneal.

These and other similar wafers were then used to fabricate transistors. FIG. 8 depicts N+/P junction leakage data of wafers treated both with and without a low temperature anneal. A reduction injunction leakage of about five times was found when a 380° C., one-hour furnace anneal was used, which increases the displacement field, while holding hydrogen in the silicon, resulting in lower junction leakage.

Figure 9:
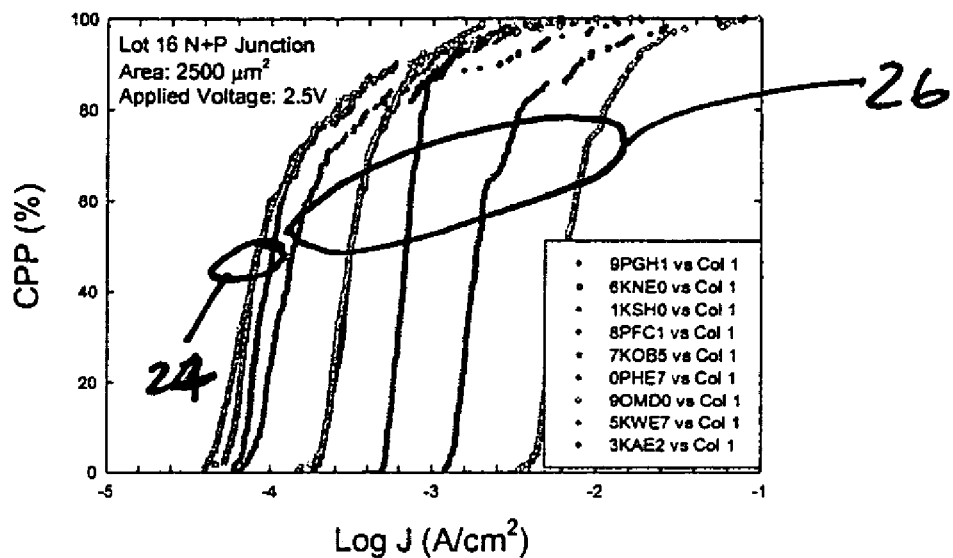
FIG. 9 depicts a N+/P junction leakage cumulative percentage plot (CCP) for wafers with and without the low temperature anneal.
Figure 10:
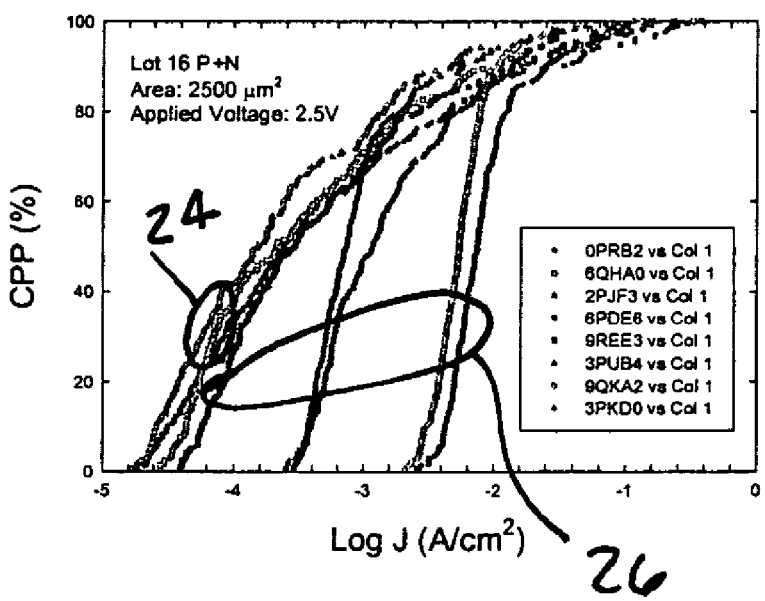
FIG. 10 depicts a P+/N junction leakage cumulative percentage plot (CCP) for wafers with and without the low temperature anneal.

FIGS. 9 and 10 compare leakage for N+/P and P+/N junctions, respectively, for another set of wafers. Plotted data from wafers which experienced the 380° C., one-hour anneal, followed by various higher temperature RTA anneals, is depicted by traces 24. Data from wafers which underwent only the higher temperature RTA anneals is depicted by traces 26. Clearly the furnace anneal significantly reduces the junction leakage for both N+/P and P+/N.

Thus, a method of low temperature anneal to reduce defects in hydrogen-implanted, relaxed SiGe layer has been disclosed. It will be appreciated that further variations and modifications thereof may be made within the scope of the invention as defined in the appended claims.

We claim:

1. A method of forming a SiGe layer having a relatively high Ge content, comprising:
seriatim
  preparing a silicon substrate;
  depositing a layer of SiGe to a thickness of between about 100 nm to 500 nm, wherein the Ge content of the SiGe layer is equal to or greater than 10%;
  implanting $H_2^+$ ions through the SiGe layer into the substrate at a dose of between about $2 \times 10^{14}$ cm$^{-2}$ to $2 \times 10^{16}$ cm$^{-2}$, at an energy of between about 20 keV to 100+ keV;
  low temperature thermal annealing at a temperature of between about 200° C. to 400° C. for between about ten minutes and ten hours;
  high temperature thermal annealing the substrate and SiGe layer, to relax the SiGe layer, in an inert atmosphere at a temperature of between about 650° C. to 1000° C. for between about 30 seconds and 30 minutes to form a relaxed SiGe buffer layer; and
  depositing a layer of tensile-strained silicon on the relaxed SiGe buffer layer to a thickness of between about 5 nm to 30 nm.

2. The method of claim 1 wherein said depositing a layer of SiGe includes depositing the layer of SiGe at a temperature of between about 400° C. to 600° C.

3. The method of claim 1 which further includes, prior to said implanting, depositing a layer of silicon oxide on the SiGe layer to a thickness of between about 50 Å to 300 Å.

4. The method of claim 1 which further includes, after said high temperature thermal annealing, depositing a layer of relaxed SiGe having a thickness of at least 100 nm on the relaxed SiGe layer.

5. The method of claim 1 wherein said low temperature thermal annealing is done in an inert atmosphere taken from the group of inert atmospheres consisting of argon and nitrogen.

6. A method of forming a SiGe layer having a relatively high Ge content, comprising:
seriatim
  preparing a silicon substrate, wherein the silicon substrate is taken from the group of substrates consisting of bulk silicon and SIMOX;
  depositing a layer of SiGe to a thickness of between about 100 nm to 500 nm, wherein the Ge content of the SiGe layer is equal to or greater than 10%, by number of atoms, and where said depositing is done at a temperature in a range of between about 400° C. and 600° C.;
  implanting $H_2^+$ ions through the SiGe layer into the substrate at a dose of between about $2 \times 10^{14}$ cm$^{-2}$ to $2 \times 10^{16}$ cm$^{-2}$, at an energy of between about 20 keV to 100+ keV;
  low temperature thermal annealing at a temperature of between about 200° C. to 400° C. for between about ten minutes and ten hours in an inert atmosphere taken from the group of inert atmospheres consisting of argon and nitrogen;
  thermal annealing the substrate and SiGe layer, to relax the SiGe layer, in an inert atmosphere at a temperature of between about 650° C. to 1000° C. for between about 30 seconds and 30 minutes to form a relaxed SiGe buffer layer; and
  depositing a layer of material taken from the group of materials consisting of tensile-strained silicon, tensile strained SiGe, compressed SiGe, and a composite stack thereof, on the relaxed SiGe buffer layer to a thickness of between about 5 nm to 30 nm.

7. The method of claim 6 which further includes, prior to said implanting, depositing a layer of silicon oxide on the SiGe layer to a thickness of between about 50 Å to 300 Å.

8. The method of claim 6 which further includes, after said high temperature thermal annealing, depositing a layer of relaxed SiGe having a thickness of about 100 nm on the relaxed SiGe layer.

9. A method of forming a SiGe layer having a relatively high Ge content, comprising:
seriatim
  preparing a silicon substrate;
  depositing a layer of SiGe to a thickness of between about 100 nm to 500 nm, wherein the Ge content of the SiGe layer is equal to or greater than 10%, by number of atoms, and at a temperature in a range of between about 400° C. to 600° C.;
  implanting $H_2^+$ ions through the SiGe layer into the substrate at a dose of between about $2 \times 10^{14}$ cm$^{-2}$ to $2 \times 10^{16}$ cm$^{-2}$, at an energy of between about 20 keV to 100+ keV;
  low temperature thermal annealing at a temperature of between about 200° C. to 400° C. for between about ten minutes and ten hours;
  thermal annealing the substrate and SiGe layer, to highly relax the SiGe layer in an inert atmosphere at a temperature of between about 650° C. to 1000° C. for between about 30 seconds and 30 minutes to form a relaxed SiGe buffer layer; and
  depositing a layer of silicon-based material on the relaxed SiGe buffer layer to a thickness of between about 5 nm to 30 nm.

10. The method of claim 9 which further includes, prior to said implanting, depositing a layer of silicon oxide on the SiGe layer to a thickness of between about 50 Å to 300 Å.

11. The method of claim 9 wherein said high temperature thermal annealing is done in an inert atmosphere taken from the group of inert atmospheres consisting of argon and nitrogen.

12. The method of claim 9 which further includes, after said thermal annealing, depositing a layer of relaxed SiGe having a thickness of at least 100 nm on the relaxed SiGe layer.

13. The method of claim 9 wherein said depositing a layer of silicon-based material on the relaxed SiGe layer includes depositing a layer of material taken from the group of materials consisting of tensile-strained silicon, tensile strained SiGe, compressed SiGe, and a composite stack thereof.

* * * * *